United States Patent [19]

Takemae et al.

[11] Patent Number: 4,903,111
[45] Date of Patent: Feb. 20, 1990

[54] INTEGRATED CIRCUIT DEVICE

[75] Inventors: Yoshihiro Takemae, Tokyo; Tomio Nakano; Masao Nakano, both of Kawasaki; Kimiaki Sato, Tokyo, all of Japan

[73] Assignee: Fujitsu Limited, Kawasaki, Japan

[21] Appl. No.: 265,275

[22] Filed: Oct. 25, 1988

Related U.S. Application Data

[63] Continuation of Ser. No. 82,948, Aug. 5, 1987, abandoned, which is a continuation of Ser. No. 931,982, Nov. 24, 1986, abandoned, and Ser. No. 687,685, Dec. 5, 1984, abandoned.

[30] Foreign Application Priority Data

Dec. 6, 1983 [JP] Japan ............... 58-229052

[51] Int. Cl.$^4$ .................. H01L 27/02; G11C 17/00; H02H 07/20
[52] U.S. Cl. .................... 357/51; 365/96; 365/200; 307/202.1
[58] Field of Search ............ 357/51; 365/96, 200; 307/202.1

[56] References Cited

U.S. PATENT DOCUMENTS

| 4,045,310 | 8/1977 | Jones et al. | 357/51 |
| 4,210,875 | 7/1980 | Beasom | 357/51 |
| 4,417,154 | 11/1983 | Kuo | 365/200 |
| 4,446,475 | 5/1984 | Gercekci et al. | 357/40 |
| 4,446,534 | 5/1984 | Smith | 365/200 |
| 4,605,872 | 8/1986 | Rung | 357/38 |

FOREIGN PATENT DOCUMENTS

| 0076967 | 4/1983 | European Pat. Off. | 357/52 |
| 54-139496 | 10/1979 | Japan | 357/51 |

OTHER PUBLICATIONS

IBM Technical Disclosure Bulletin, vol. 19, No. 4, Sep. 1976, "Monolithic Integrated Circuit Fuse Link", B. J. Deliduka et al., p. 1161.

Primary Examiner—J. Carroll
Attorney, Agent, or Firm—Staas & Halsey

[57] ABSTRACT

A semiconductor integrated circuit device having a fuse-blown type ROM for storing information concerning defective bits for the replacement of defective bits in a semiconductor memory device, etc., with redundant bits. The integrated circuit device comprises fuses for constituting the ROM, pads for supplying a melting current to the fuses, and PN junctions each being formed, for example, by a semiconductor substrate and a diffusion layer formed on the semiconductor substrate. Each of the fuses is melted by applying voltage to a circuit connecting the PN junction, the fuse, and the pad so that the PN junction is forward biased, thereby supplying a large current to the fuse.

2 Claims, 7 Drawing Sheets

INTEGRATED CIRCUIT DEVICE

This is a continuation of co-pending application Ser. No. 082,948 filed on Aug. 5, 1987, now abandoned which is a continuation of Ser. No. 931,982 filed Nov. 24, 1986 and Ser. No. 687,685 filed Dec. 5, 1984, now both abandoned.

BACKGROUND OF THE INVENTION

The present invention relates to a semiconductor integrated circuit device, more particularly to a semiconductor integrated circuit device provided with a read-only memory for storing information concerning defective bits for the replacement of defective bits in a semiconductor memory device, etc., with redundant bits.

In general, in a semiconductor memory device, an operational test is conducted at the wafer stage to detect defective bits. The defective bits are switched with separately provided redundant bits, thus preventing reduced yield of the devices. Such a semiconductor memory device stores the information concerning the defective bits and, when these defective bits are accessed, operates so that the redundant bits are accessed. Therefore, when defective bits are detected at the wafer stage, the information concerning the defective bits must be stored in the read-only memory (ROM) using fuses, etc. For a ROM to be used for this purpose, it is necessary that the writing be performed reliably, the space occupied on the semiconductor chip be small, and the operation after the writing be performed reliably.

In a conventional semiconductor integrated circuit device, a fuse-blown type ROM is used to store the information concerning the defective bits, and the write operation to the ROM is effected by melting one or more fuses by supplying a large current to the fuses via one or more switching transistors.

This device has a drawback in that the fuses of the ROM cannot be reliably melted because the current flowing therethrough is limited by the current capacity and the withstand voltage of the switching transistors.

There is known another semiconductor integrated circuit device using a fuse-blown type ROM, wherein the write operation to the ROM is effected by supplying a large current to each fuse of the ROM directly via a probing pad.

This device has disadvantages in that the degree of integration is deteriorated because it is necessary to provide a probing pad for each fuse.

SUMMARY OF THE INVENTION

In order to solve the above-mentioned problems of the conventional device, the present invention adopts an idea of supplying a current for melting a fuse of a fuse-blown type ROM device by realizing a forward-biased condition of a PN junction comprised by a semiconductor substrate and a diffusion layer formed thereon.

It is an object of the present invention to enable a sufficiently large current to be passed through the fuse so as to enable reliable write operation of the ROM circuit.

It is another object of the present invention to make it possible to provide probing pads within the scribe lines so as to improve the degree of integration of the semicondcutor integrated circuit device.

According to the present invention, there is provided an integrated circuit device comprising: one or more fuses for constituting a read-only memory circuit; one or more pads for supplying melting current to the fuses; and one or more PN junctions each being formed by joining a first semiconductor layer having a first conductivity type and a second semiconductor layer having a second conductivity type which is opposite to the first conductivity type. One end of each of the fuses is connected to the first semiconductor layer and the other end thereof is connected to one of the pads, and a voltage is supplied to a circuit including the PN junction, the fuse, and the pad so that the PN junction is forward-biased, whereby current flows through the circuit to melt the fuse.

DESCRIPTION OF THE PREFERRED EMBODIMENTS

Before describing the preferred embodiments, an explanation will be made of a conventional semiconductor integrated circuit device.

Figure 1:
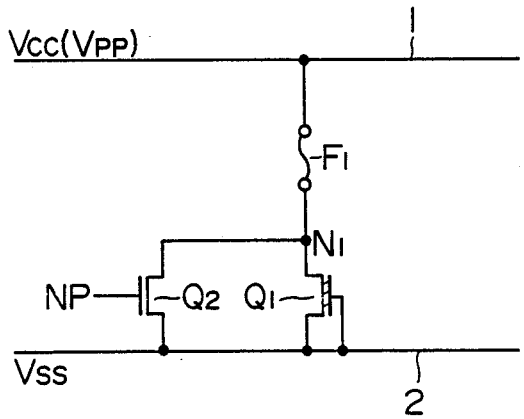
FIG. 1 and FIG. 2 are electric circuit diagrams showing a ROM circuit used in a conventional IC device.

FIG. 1 shows a ROM for storing defective bits used in a conventional semiconductor integrated circuit device (hereinafter, IC device). The illustrated ROM is provided with a fuse $F_1$ connected in series between power lines 1 and 2, a depletion transistor $Q_1$, and a transistor $Q_2$ connected in parallel with the depletion transistor $Q_1$. The gate of the depletion transistor $Q_1$ is connected to the source of the same transistor.

In the circuit of FIG. 1, when the fuse $F_1$ is melted to write data, a high voltage $V_{PP}$ is applied to the power line 1, a high level write signal NP is applied to the gate of the transistor $Q_2$, and the transistor $Q_2$ is turned ON. Thus, a high voltage $V_{PP}$ is applied to the fuse $F_1$ and the fuse is melted.

In normal operation, the usual operational power (for example, +5 V) is applied to the power line 1, and a low voltage power $V_{SS}$ (for example, 0 V) is applied to the power line 2. If the fuse $F_1$ is melted, the voltage at the node $N_1$ becomes equal to $V_{SS}$, while if the fuse $F_1$ is not melted, the voltage at the node $N_1$ becomes roughly equal to $V_{CC}$. Therefore, by detecting the voltage at the node $N_1$, it can be determined whether the fuse $F_1$ is written, i.e., whether the accessed bit is a defective bit. The write signal NP is applied through a probing pad provided on the semiconductor chip. According to the ROM circuit of FIG. 1, the probing pad may be provided within the scribe lines. This enables reduction of the space occupied by the ROM circuit and prevention of a reduced degree of integration of the IC device. Incidentally, when the probing pad is provided within the scribe lines, the probing pad, i.e., the gate of the transistor $Q_2$, may short-circuit to the substrate potential $V_{SS}$ during wafer cutting. Even when such a short-circuit is caused, however, there is no effect whatsoever on the later operation of the ROM circuit.

However, in the ROM circuit of FIG. 1, the maximum value of the current flowing through the fuse $F_1$ is limited by the $G_m$, etc. of the transistor $Q_2$, making it difficult to pass a sufficiently large current to the fuse $F_1$. Also, when the transistor $Q_2$ is in the OFF state, the magnitude of the voltage applied between the power lines 1 and 2 is limited by the withstand voltage between the drain and source and between the drain and gate of the transistor $Q_2$. Therefore, it is impossible to sufficiently raise the voltage of the high-voltage power $V_{PP}$.

Figure 2:
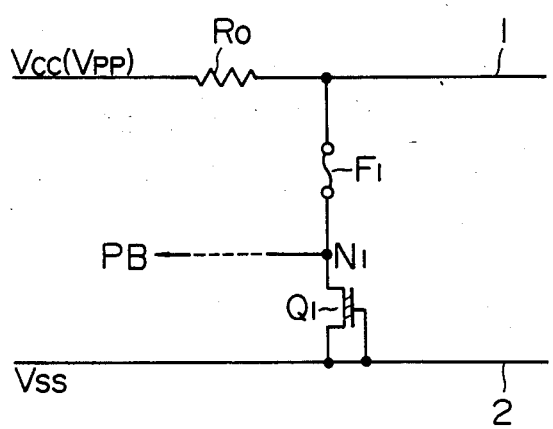

FIG. 2 shows another conventional ROM circuit. The illustrated circuit, instead of using the transistor $Q_2$ in the circuit of FIG. 1, connects the connection point $N_1$ of the fuse $F_1$ and the transistor $Q_1$ directly to the probing pad. When melting the fuse $F_1$, a high voltage $V_{PP}$ is supplied on the power line 1 and the node $N_1$ is connected to the power line 2 through the probing pad PB.

In the circuit of FIG. 2, there is no restriction on the maximum current of the fuse $F_1$ and it is possible to sufficiently raise the voltage $V_{PP}$ of the power line 1. However, in this circuit, short-circuiting of the probing pad with other nodes for some reason or another will result in an error in operation. In particular, if the probing pad is provided inside the scribe lines, wafer cutting can cause short-circuiting of the probing pad and, therefore, short circuiting of the node $N_1$ with the substrate. Therefore, regardless of the disconnected state of the fuse $F_1$, the node $N_1$ will maintain the substrate potential (low level), and thus it is not possible to provide the pad within the scribe lines. Also, a probing pad must be provided for each fuse, which reduces the degree of integration of the IC device.

The possibility of the danger of the short-circuiting of a probing pad on a scribe line with the power source $V_{SS}$ can be understood in connection with to FIGS. 8A and 8B, which are described below as showing a probing pad provided within a scribe line portion according to the present invention. If a probe is to be brought into contact with an aluminum pad 27, usually, a thick and hard field oxide layer 30 is provided beneath the aluminum pad. Since no N type diffusion layer is formed beneath the field oxide according to ordinary processing, so that no N-type diffusion layer exists directly beneath an aluminum pad in the prior art. Accordingly if a field oxide directly beneath such an aluminum pad is broken, there is a high possibility of the aluminum pad becoming short-circuited with the power source $V_{SS}$ connected to the substrate.

Also scribing or cutting by, for example, a scriber or the like, is to be carried out later along the scribe line, namely after selectively blowing the fuses. Mechanical damage is apt to occur in the field oxide during such scribing or cutting. Hence, there is a further possibility of short-circuiting the aluminum pad to the power source voltage to which the substrate may be set.

Further, even when the probing pad is not provided within the scribe lines, if there is a resistance $R_0$ due to a bridge at the $V_{CC}$ power line, the current passing through the fuse $F_1$ is restricted by the resistance $R_0$ and current sufficient for melting cannot be passed. In some cases, such a bridge is unavoidable due to the pattern layout. In such cases, the same disadvantages as with the conventional example of FIG. 1 occur.

Figure 3:
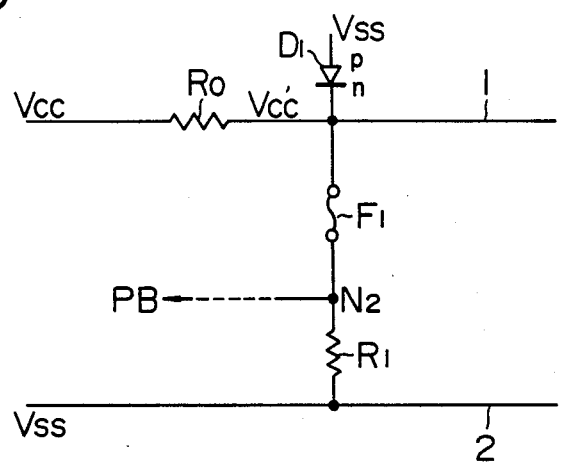
FIG. 3 and FIG. 4 are electric circuit diagrams showing ROM circuits used in an IC device according to embodiments of the present invention.

Below, a description will be given of an embodiment of the present invention which overcomes the above problems in reference to the drawings. FIG. 3 shows a ROM circuit used for an IC device according to an embodiment of the present invention. The ROM circuit of the figure is provided with a fuse $F_1$ and resistor $R_1$ connected in series between the power lines 1 and 2. The connection point between the fuse $F_1$ and the resistor $R_1$, i.e., the node $N_2$, is connected to a probing pad, not shown. The power line 1 has a resistance $R_0$ due to a bridge.

Here, for realizing the characteristics of the present invention, it is important that the power line side of the fuse $F_1$ have a diffusion layer, and, thereby, there is a PN junction between the substrate and the power line, and that the other end of the fuse, i.e., the node $N_2$, have no diffusion layer. By giving the node $N_2$ a voltage sufficiently negative from the substrate potential, the PN junction $D_1$ becomes forward-biased and the current flows by the route connecting substrate, PN junction $D_1$, fuse $F_1$, the node $N_2$, probing pad. In this route, there are no factors restricting the current, and the necessary current sufficient for melting is passed to the fuse.

Figure 4:
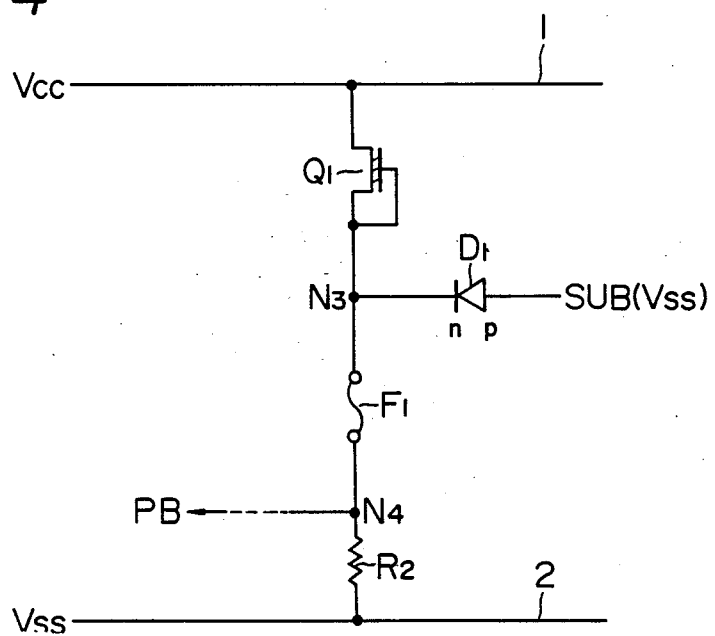

FIG. 4 shows a ROM circuit used for the IC device according to another embodiment of the present invention. The ROM circuit of the figure is provided with a depletion transistor $Q_1$, fuse $F_1$ and resistor $R_2$ connected in series between the power lines 1 and 2. The gate and source of the depletion transistor $Q_1$ are mutually connected and are connected to the fuse $F_1$ and through the node $N_3$. The connection point between the fuse $F_1$ and the resistor $R_2$, i.e., the node $N_4$, is connected to a probing pad (not shown). The diode $D_1$ indicates a PN junction comprised by a P-type semiconductor substrate and a source electrode or other diffusion layer of a transistor $Q_1$ formed on the substrate. The probing pad connected to the node $N_4$ can, for example, be provided within the scribe lines. Here, it is important that no diffusion layer exist at the locations connected in series to the node $N_4$ and the routes from there to the probing pads, i.e., that electrical isolation be maintained from the substrate.

In the ROM circuit of FIG. 4, when melting the fuse $F_1$ so as to write-in data, a sufficient large negative voltage compared with the substrate potential $V_{ss}$ is supplied to the probing pad, i.e., the node $N_4$. By this, the PN junction $D_1$ comprised by the P-type semiconductor substrate and the N-type diffusion layer in the node $N_3$ is biased in the forward direction, current flows through the route connecting the substrate, PN junction $D_1$, fuse $F_1$, and probing pad, and the fuse is melted. In this case, the voltage supplied to the probing pad is almost completely, with the exception of the forward voltage component of the PN junction $D_1$, supplied to the fuse $F_1$, thereby enabling the fuse $F_1$ to be reliably cut.

In this way, if wafer scribing is performed after completion of writing, the probing pad is usually short-circuited with the substrate. By this, the node $N_4$ is connected to the power line 2. Incidentally, in consideration of cases where the probing pad is not necessarily short-circuited with the substrate due to the scribing, a resistance $R_2$ is provided. The end of the resistance $R_2$ on the node $N_4$ side must not have a diffusion layer so that melting current can be concentrated at the fuse $F_1$ during writing, but the end on the $V_{ss}$ side may have a diffusion layer so long as the value of the resistance $R_2$ is of a magnitude passing only an allowable writing current. In either case, the node $N_4$ is connected with the power line 2. In the usual state of use of the IC device, the power line 1 is supplied with a power voltage $V_{cc}$ of, for example, 5 V, and the power line 2 is supplied with a power voltage $V_{ss}$ of, for example, 0 V. Therefore, if the fuse $F_1$ is melted, the potential of the node $N_3$ becomes $V_{cc}$. If the fuse $F_1$ is not melted, the potential of the node $N_3$ becomes about $V_{ss}$, i.e., the substrate potential. By detecting the voltage of the node $N_3$ by a detection circuit, not shown, it can be judged whether a bit is defective. This detection circuit is comprised so as to have at its input terminal a MIS transistor with a gate connected to the node $N_3$. Therefore, there is no diffusion layer directly connected to the node $N_3$ even on the route from the node $N_3$ to the detection circuit. The transistor $Q_1$ is used as a load resistance, but it is necessary that the value of this load resistance be made sufficiently large so as to reduce the power consumed by the ROM circuit. This load resistance can be realized by polycrystalline silicon, etc.

Figure 5:
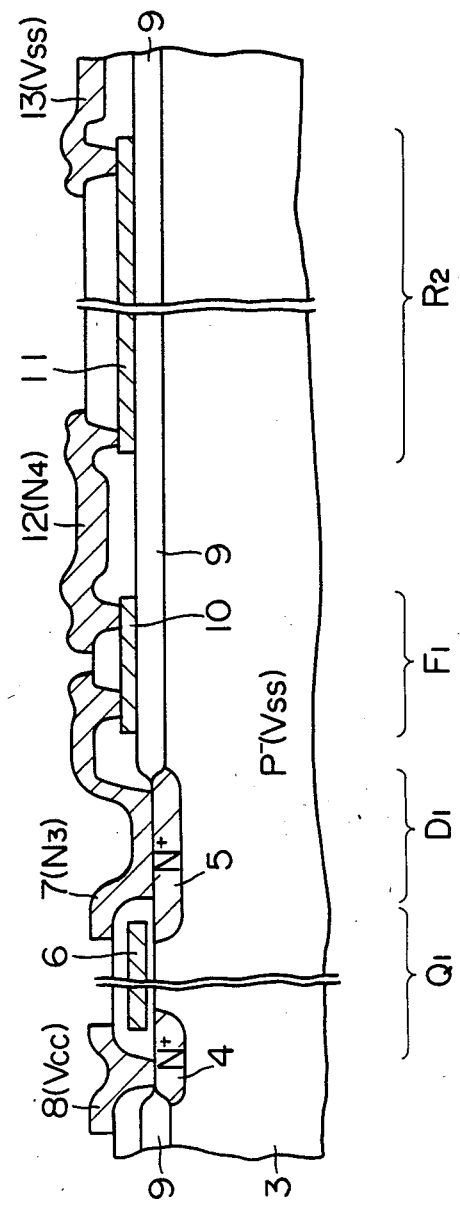
FIG. 5 is a cross-sectional view showing the concrete construction of the circuit of FIG. 4.

FIG. 5 is a cross-sectional view showing the concrete structure of the circuit of FIG. 4. In the figure, the transistor $Q_1$ uses $N^+$-type diffusion layers 4 and 5 formed on a $P^-$-type semiconductor substrate 3 as its drain and source and uses a conductive layer 6 made of polycrystalline silicon, etc. formed on the channel region between the $N^+$-type diffusion layers 4 and 5 as its gate. The aluminum wiring 7 connected to the source diffusion layer 5 is connected with the gate 6 at a not shown portion, and the aluminum wiring layer 8 connected to the drain diffusion layer 4 is supplied with a power voltage $V_{cc}$. The channel of the transistor $Q_1$ is formed to be considerably large so as to increase the resistance value.

The diode $D_1$ is formed by the PN junction between the $P^-$-type substrate 3 and the source diffusion layer 5. The fuse $F_1$ is comprised by a polycrystalline silicon layer 10 provided on a field oxide layer 9 formed on the substrate 3. The resistance $R_2$ is comprised by a thin polycrystalline silicon layer 11 formed on the same field oxide layer 9. One end is connected to one end of the polycrystalline silicon layer 10 comprising the fuse $F_1$ by an aluminum wiring 12. Further, aluminum wiring 13 connected to the other end of the polycrystalline silicon layer 11 is supplied with the substrate voltage $V_{ss}$. The aluminum wiring 12 is connected to a probing pad (not shown). As shown in the figure, the node $N_4$ does not have a diffusion layer.

In the construction of FIG. 5, when melting the fuse $F_1$, the probing pad, and therefore, the aluminum wiring 12, is supplied with a sufficiently low voltage compared with the substrate voltage $V_{ss}$. By this, current flows by the route connecting the substrate 3, source diffusion layer 5, aluminum wiring 7, polycrystalline layer 10, and aluminum wiring 12, and the polycrystalline silicon layer 10, i.e., the fuse $F_1$, is melted.

Figure 6:
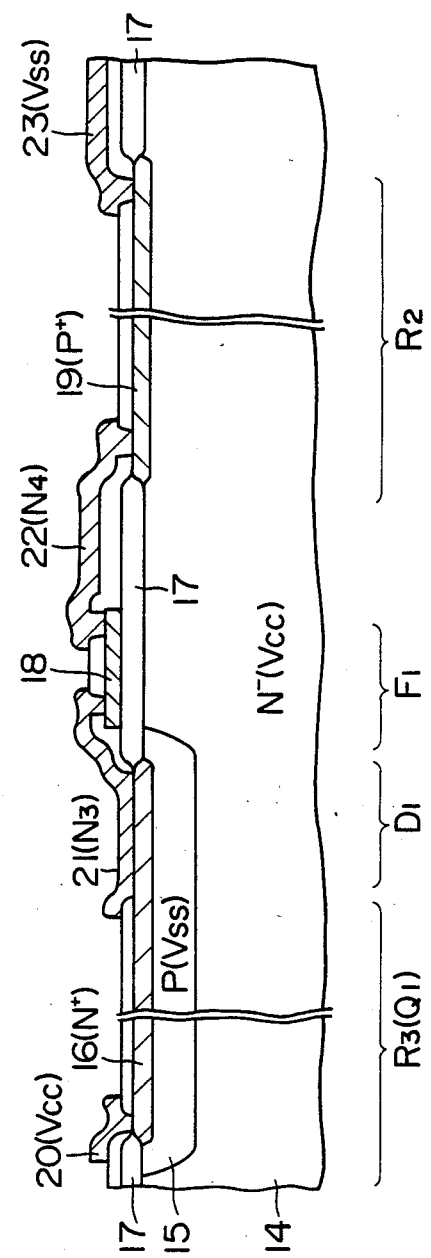
FIG. 6 is a cross-sectional view of an IC device wherein the same circuit an shown in FIG. 4 is realized by a CMOS construction.

FIG. 6 is a cross-sectional view showing the construction of the ROM circuit of FIG. 4 using a CMOS construction. The construction of FIG. 6 utilizes, in place of the transistor $Q_1$, a resistor $R_3$ comprised by a elongated $N^+$-type diffusion layer 16 formed on a P-type well 15 formed on the $N^-$-type semiconductor substrate 14. The diode $D_1$ is comprised by a PN junction between the P-type well 15 and the $N^+$-type diffusion layer 16. The fuse $F_1$ is comprised by a polycrystalline silicon layer 18 formed on the field oxide layer 17 in the same way as in the case of FIG. 5. Further, the resistor $R_2$ is comprised by the elongated $P^+$-type diffusion layer 19 formed on the $N^-$-type substrate 14. Reference numerals 20, 21, 22, and 23 are aluminum wiring.

In the construction of FIG. 6, the diffusion layer 16 comprising the load resistor $R_3$ is formed on the P-type well 15, and the diffusion layer 19 comprising the resistor $R_2$ is formed on the substrate 14. It is also possible to directly form the diffusion layer 16 on the substrate 14 and to form the diffusion layer 19 on the P-type well. When comprised by a CMOS in this way, the object of the present invention can be achieved even if there is a diffusion layer 19 at the node $N_4$. This is because, when $N_4$ is given a potential lower than $V_{cc}$, the substrate 14 and the diffusion layer 19 become reversely biased and enter a nonconductance state, which is equivalent, in practice, to there being no diffusion layer.

In the construction of FIG. 6, when melting the fuse $F_1$, the P-type well 15 is supplied with the voltage $V_{ss}$, for example, 0 V, while the aluminum wiring 22 connected to the probing pad is supplied with a voltage sufficiently lower than the voltage $V_{ss}$. By this, a current flows through the route connecting the P-type well 15, $N^+$-type diffusion layer 16, aluminum wiring layer 21, polycrystalline silicon layer 18, and aluminum wiring layer 22, and the fuse $F_1$, i.e., the polycrystalline layer 18, is cut.

Figure 7:
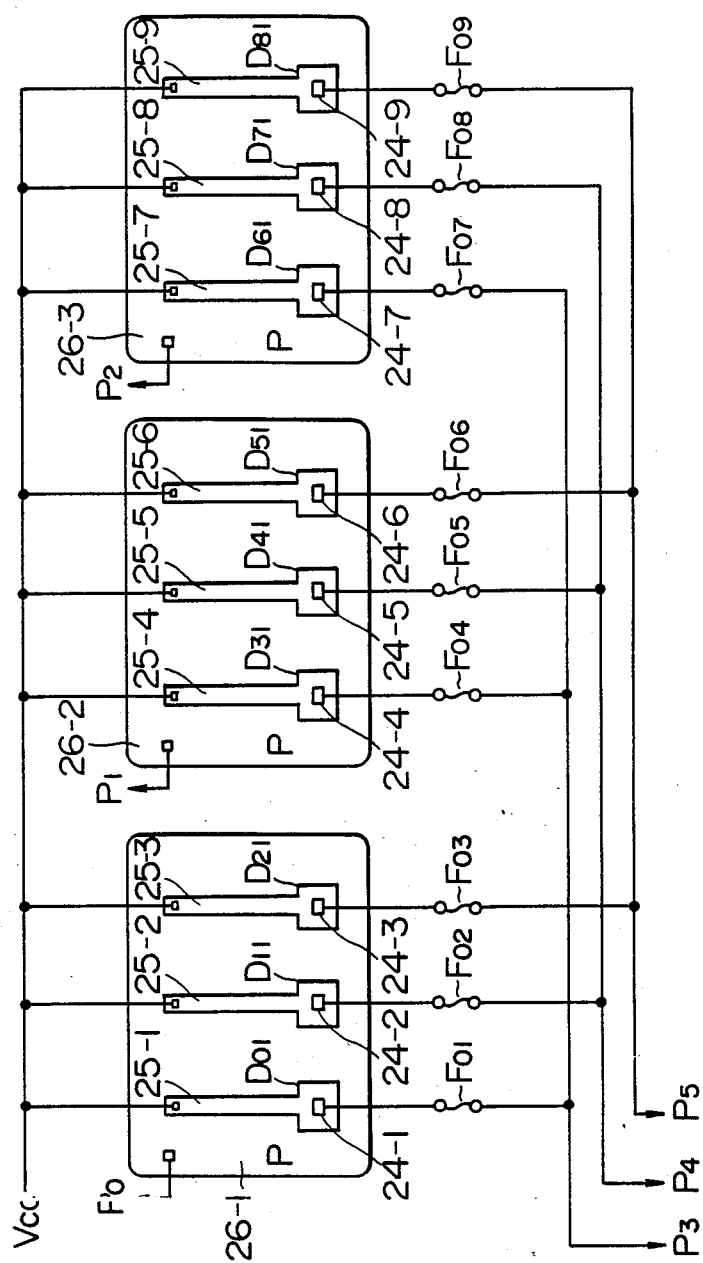
FIG. 7 is a block circuit diagram showing an example of an ROM circuit using a plurality of fuses.

FIG. 7 shows a circuit wherein a ROM circuit having a plurality of fuses is comprised by a CMOS construction in the same way as FIG. 6. The ROM circuit of the figure has nine fuses $F_{01}, F_{02}, \ldots, F_{09}$, the ends of these fuses being connected through the contact windows 24-1, 24-2, ..., 24-9 to the $N^+$-type diffusion layer 25-1, 25-2, ..., 25-9. The $N^+$-type diffusion layers 25-1, 25-2, and 25-3 are formed on the P-type well 26-1, the $N^+$-type diffusion layers 25-4, 25-5, and 25-6 are formed on the P-type well 26-2, and the $N^+$-type diffusion layers 25-7, 25-8, and 25-9 are formed on the P-type well 26-3. The end portions of the contact windows 24-1, 24-2, ..., 24-9 of the $N^+$-type diffusion layers 25-1, 25-2, ..., 25-9, comprise diodes $D_{01}, D_{11}, \ldots, D_{81}$, with the corresponding P-type wells and are given a wide shape, enlarging the junction area with the corresponding P-type wells so as to enable the flow of a large current. The other ends of the $N^+$-type diffusion layers 25-1, 25-2, ..., 25-9 are supplied with the power voltage $V_{cc}$.

In the circuit of FIG. 7 six probing pads $P_0$, $P_1$, $P_2$, $P_3$, $P_4$, $P_5$ are provided for the nine fuses $F_{01}, F_{02}, \ldots, F_{09}$. The probing pads $P_0$, $P_1$, and $P_2$ are connected to the P-type wells 26-1, 26-2, and 26-3. The probing pad $P_3$ is connected to the other ends of the fuses $F_{01}$, $F_{04}$, and $F_{07}$, the probing pad $P_4$ is connected to the other end of the fuses $F_{02}$, $F_{05}$, and $F_{08}$, and the probing pad $P_5$ is connected to the other end of the fuses $F_{03}$, $F_{06}$, and $F_{09}$. By this constitution, when for example, cutting the fuse $F_{01}$, a voltage is supplied between the probing pads $P_0$ and $P_3$. When cutting the fuse $F_{02}$, a voltage is supplied between the probing pads $P_0$ and $P_4$. Further, when, for example, cutting the fuse $F_{06}$, a voltage is supplied between the probing pads $P_1$ and $P_5$.

In this way, by use of the construction of FIG. 7, it is possible to provide a smaller number of probing pads than the number of fuses used for the selection and melting of the fuses and is therefore possible to improve the degree of integration of the IC device. In general, if the number of probing pads is $n_p$ and the number of fuses is $n_f$, then $(N_p/2)^2 = n_f$.

Figure 8A:
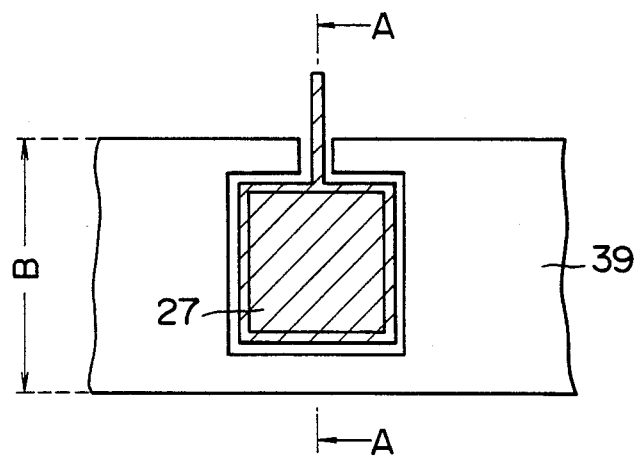
FIGS. 8A and 8B are a plan view and the A—A line cross-sectional view showing an example of the construction of a probing pad in an IC device according to the present invention.
Figure 8B:
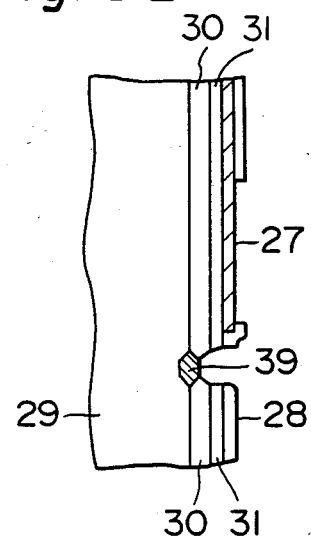

FIGS. 8A and 8B show the construction where the probing pads of the IC device are provided according to an embodiment of the present invention within the scribe line portion B. FIG. 8A is a plan view, and FIG. 8B is a cross-sectional view on the line A—A. In these figures, the portion shown by hatched lines is the aluminum wiring layer 27, for example, connected to the node $N_4$ in the circuit of FIG. 4. Reference numeral 28 is a cover insulation film and is formed for the scribe line portion B except the portion of the aluminum wiring layer 27 comprising the probing pads. Further, 29 is a semiconductor substrate, 30 a field oxide layer, and 31 an insulating film for insulation the aluminum wiring layer and the polycrystalline silicon layer comprising the gate electrodes, etc. Reference numeral 39 is a diffusion layer and, as shown in the figure, the probing pad portions have no diffusion layers.

In this construction, as stated above, an inspection is performed for defective bits and the like at the wafer stage, voltage is supplied on the probing pads so as to cut the required fuses, then the wafer is cut along the scribe line portion.

Figure 9A:
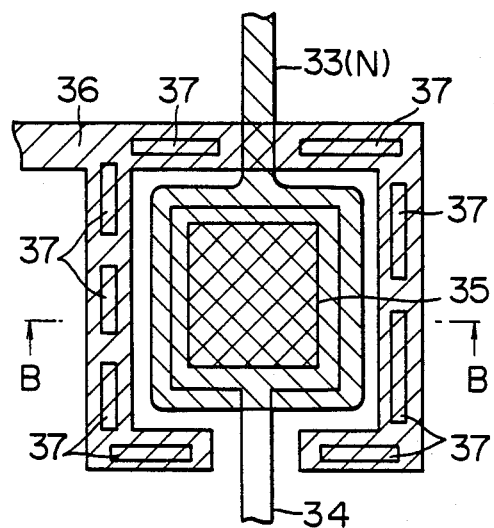
FIGS. 9A and 9B are a plan view and B—B line cross-sectional view showing the PN junction portion of an IC device according to the present invention.
Figure 9B:
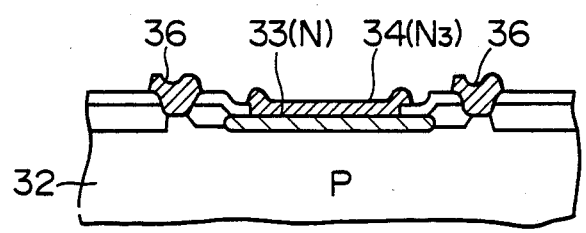

FIGS. 9A and 9B show the construction of an optimal PN junction portion using the ROM circuit according to the above-mentioned embodiment. In the figures, 32 shows a P-type semiconductor substrate or P-type well or other P-type region, and 33 an N-type diffusion layer formed on the P-type region 32. Reference numeral 34 is an aluminum wiring layer connected to the N-type diffusion layer 33 in the contact window 35 and is, for example, connected to one end of the fuse $F_1$. The N-type diffusion layer 33 is connected to the source, etc., of, for example, the transistor $Q_1$. Reference numeral 36 is an aluminum wiring layer connected to the P-type region 32 in the contact windows 37 and is supplied with, for example, the power voltage $V_{ss}$. In the construction of FIGS. 9A and 9B, the area of the junction portion between the P-type region 32 and the N-type diffusion layer 33 is made large and an aluminum wiring layer is provided so as to surround the N-type region 33. Therefore, it is possible to reduce the voltage drop of the PN junction portion and to pass a large current.

As explained above, the present invention makes it possible to supply a voltage and current with a sufficient leeway to fuses without limitation due to the withstand voltage, allowable current, etc. of the transistors and other circuit elements and therefore, enables reliable melting of fuses. Further, it enables the provision of the probing pads within the scribe line portion and further enables provision of a fewer number of probing pads than fuses for achievement of the objective. Therefore, it enables reduction of the occupied area of the ROM circuit and improvement of the degree of integration of the IC device.

We claim:

1. An integrated circuit device comprising:
   a semiconductor substrate;
   a first plurality of well regions in said substrate of a first conductivity type, with each said well region having a respective probing pad;
   a second plurality of elongated regions of a second conductivity type in each said well region, with each said elongated region having at a first end thereof a contact in common with the first end of each of the others of said elongated regions,
   a third plurality of fuses, the number of said third plurality being the product of the numbers of said first and second pluralities, each said fuse being connected at a first end to the second end of a respective one of said elongated regions, and the other end of each said fuse being connected in common with the second end of the same corresponding one of said elongated regions in each said well region;
   a plurality of further probing pads, each connected to a respective one of the common connections of said second ends of the fuses, the number of said further probing pads being that of said second plurality.

2. The integrated circuit device of claim 1, wherein for np equal to the number of said probing pads and nf the number of said third plurality of fuses, the relation $(np/2)^2 = nf$ obtains.

* * * * *

UNITED STATES PATENT AND TRADEMARK OFFICE
CERTIFICATE OF CORRECTION

PATENT NO. : 4,903,111
DATED : FEBRUARY 20, 1990
INVENTOR(S) : YOSHIHIRO TAKEMAE ET AL.

It is certified that error appears in the above-identified patent and that said Letters Patent is hereby corrected as shown below:

FRONT PAGE [63] line 3, "Ser. No. 687,685," should be --Serial No. 678,685,--.

Col. 1, line 7, "Ser. No. 687,685" should be --Ser. No. 678,685--.

Col. 2, line 26, "an shown" to be --as shown--.

Col. 3, line 45, "with to" should be --with--.

Col. 7, line 3, "$(N_p/2)^2$" should be --$(n_p/2)^2$--;
line 16, "insulating" should be --insulation--; and
line 16, "insulation" should be --insulating--.

Signed and Sealed this

Ninth Day of April, 1991

Attest:

HARRY F. MANBECK, JR.

*Attesting Officer*       Commissioner of Patents and Trademarks